United States Patent
Jang et al.

(10) Patent No.: US 7,405,161 B2
(45) Date of Patent: Jul. 29, 2008

(54) METHOD FOR FABRICATING A SEMICONDUCTOR DEVICE

(75) Inventors: Jeong Yel Jang, Suwon (KR); Kang Hyun Lee, Yongin (KR)

(73) Assignee: Dongbu Electronics Co., Ltd., Seoul (KR)

( * ) Notice: Subject to any disclaimer, the term of this patent is extended or adjusted under 35 U.S.C. 154(b) by 121 days.

(21) Appl. No.: 11/320,977

(22) Filed: Dec. 30, 2005

(65) Prior Publication Data

US 2007/0049039 A1 Mar. 1, 2007

(30) Foreign Application Priority Data

Aug. 31, 2005 (KR) ...................... 10-2005-0080708

(51) Int. Cl.
*H01L 21/3065* (2006.01)
*H01L 21/308* (2006.01)
*H01L 21/28* (2006.01)
*H01L 21/3213* (2006.01)

(52) U.S. Cl. ..................... 438/717; 438/585; 438/710; 430/317; 216/41; 216/49; 216/51; 216/67; 216/79

(58) Field of Classification Search ................ 438/710, 438/717, 729, 585; 216/41, 49, 51, 67, 71, 216/74, 79; 430/317
See application file for complete search history.

(56) References Cited

U.S. PATENT DOCUMENTS

| 5,804,088 | A | * | 9/1998 | McKee ........................ 216/47 |
| 5,976,769 | A | * | 11/1999 | Chapman ..................... 430/316 |
| 6,010,829 | A | * | 1/2000 | Rogers et al. ................ 430/316 |
| 6,025,273 | A | * | 2/2000 | Chen et al. ................... 438/706 |
| 6,037,266 | A | * | 3/2000 | Tao et al. ..................... 438/719 |
| 6,063,547 | A | * | 5/2000 | Ye et al. ...................... 430/313 |
| 6,156,629 | A | * | 12/2000 | Tao et al. ..................... 438/535 |
| 6,187,688 | B1 | * | 2/2001 | Ohkuni et al. ............... 438/725 |
| 6,242,350 | B1 | * | 6/2001 | Tao et al. ..................... 438/690 |
| 6,277,716 | B1 | * | 8/2001 | Chhagan et al. ............. 438/584 |
| 6,283,131 | B1 | * | 9/2001 | Chen et al. ................... 134/1.2 |
| 6,300,251 | B1 | * | 10/2001 | Pradeep et al. .............. 438/710 |
| 6,358,859 | B1 | * | 3/2002 | Lo et al. ...................... 438/712 |
| 6,372,645 | B1 | * | 4/2002 | Liu et al. ..................... 438/688 |
| 6,383,941 | B1 | * | 5/2002 | Shen et al. ................... 438/714 |
| 6,432,832 | B1 | * | 8/2002 | Miller et al. ................. 438/713 |
| 6,541,843 | B2 | * | 4/2003 | Yin et al. ..................... 257/639 |
| 6,579,812 | B2 | * | 6/2003 | Chen .......................... 438/780 |
| 6,677,255 | B1 | * | 1/2004 | Shih et al. ................... 438/786 |

(Continued)

FOREIGN PATENT DOCUMENTS

KR 2004-065034 * 7/2004

*Primary Examiner*—M. Wilczewski
(74) *Attorney, Agent, or Firm*—McKenna Long & Aldridge LLP

(57) ABSTRACT

Method for fabricating a semiconductor device in which a by-product of etching is deposited on a photoresist film for using as a mask. The method for fabricating a semiconductor device includes the steps of depositing a polysilicon, and a bottom anti-refection coating on an entire surface of a substrate in succession, forming a photoresist film pattern on a predetermined portion of the bottom anti-refection coating, etching the bottom anti-refection coating by using the photoresist film pattern to deposit by-product of the etching on sidewalls of the photoresist pattern to form spacers, and etching the polysilicon by using the photoresist film pattern and the spacers, to form a line.

8 Claims, 7 Drawing Sheets

U.S. PATENT DOCUMENTS

| | | | |
|---|---|---|---|
| 6,713,402 B2 * | 3/2004 | Smith et al. | 438/710 |
| 6,758,223 B1 * | 7/2004 | Cowley et al. | 134/1.2 |
| 6,759,263 B2 * | 7/2004 | Ying et al. | 438/48 |
| 6,893,893 B2 * | 5/2005 | Nallan et al. | 438/61 |
| 6,933,239 B2 * | 8/2005 | Ying et al. | 438/706 |
| 6,964,928 B2 * | 11/2005 | Ying et al. | 438/706 |
| 6,984,585 B2 * | 1/2006 | Ying et al. | 438/689 |
| 7,078,351 B2 * | 7/2006 | Chiu et al. | 438/736 |
| 7,094,613 B2 * | 8/2006 | Mui et al. | 438/9 |
| 7,105,361 B2 * | 9/2006 | Chen et al. | 438/3 |
| 7,151,055 B2 * | 12/2006 | Aminpur et al. | 438/637 |
| 7,163,879 B2 * | 1/2007 | Tamura | 438/585 |
| 7,192,878 B2 * | 3/2007 | Weng et al. | 438/734 |
| 7,195,716 B2 * | 3/2007 | Chou | 216/41 |
| 7,214,626 B2 * | 5/2007 | Huang | 438/734 |
| 7,229,925 B2 * | 6/2007 | Kim | 438/689 |
| 7,288,488 B2 * | 10/2007 | Zhu et al. | 438/726 |
| 7,294,908 B2 * | 11/2007 | Jang et al. | 257/623 |
| 2003/0092281 A1 * | 5/2003 | Ramachandramurthy et al. | 438/725 |
| 2003/0180968 A1 * | 9/2003 | Nallan et al. | 438/3 |
| 2003/0181056 A1 * | 9/2003 | Kumar et al. | 438/710 |
| 2004/0026369 A1 * | 2/2004 | Ying et al. | 216/63 |
| 2004/0029393 A1 * | 2/2004 | Ying et al. | 438/745 |
| 2004/0038436 A1 * | 2/2004 | Mori et al. | 438/17 |
| 2004/0043526 A1 * | 3/2004 | Ying et al. | 438/38 |
| 2004/0043620 A1 * | 3/2004 | Ying et al. | 438/710 |
| 2006/0076313 A1 * | 4/2006 | Chou | 216/41 |
| 2007/0037101 A1 * | 2/2007 | Morioka | 430/313 |
| 2007/0037396 A1 * | 2/2007 | Verhaverbeke | 438/689 |
| 2007/0042603 A1 * | 2/2007 | Kropewnicki et al. | 438/689 |
| 2007/0059937 A1 * | 3/2007 | Kang | 438/703 |
| 2007/0077782 A1 * | 4/2007 | Lee et al. | 438/781 |
| 2007/0082481 A1 * | 4/2007 | Jung | 438/629 |
| 2007/0122753 A1 * | 5/2007 | Jang | 430/316 |

* cited by examiner

METHOD FOR FABRICATING A SEMICONDUCTOR DEVICE

CROSS-REFERENCE TO RELATED APPLICATION

This application claims the benefit of Korean Application No. P2005-80708, filed on Aug. 31, 2005, which is hereby incorporated by reference for all purposes as if fully set forth herein.

BACKGROUND OF THE INVENTION

1. Field of the Invention

The present invention relates to semiconductor devices, and more particularly, to a method for fabricating a semiconductor device in which etching by-product is deposited on a photoresist film used as a mask.

2. Discussion of the Related Art

In a logic device, particularly, a flash memory device, the higher the packing density of the device, the smaller the Critical Dimension (CD) becomes. Consequently, if a floating gate pattern of the critical dimension below 130 nm is to be formed, not only the critical dimension of the gate pattern, but also the critical dimension of a space between adjacent gate lines becomes smaller, i.e. below 100 nm.

This requires reducing the thickness of the photoresist film to match the depth of focus of a KrF light source of a 248 nm wavelength. However, a balance must be achieved between reducing the thickness of the photoresist film for matching a depth of focus and maintaining a minimum required thickness of the photoresist film for etching. If the proper thickness of the photoresist film is not obtained, a defective pattern, such as deformation, or collapse of the pattern, is likely to happen.

To solve this problem, instead of using a KrF light source, an ArF light source of a 193 nm wavelength can be used in fabrication of a polysilicon transistor. However, since the critical dimension of a space between adjacent gate patterns is below 100 nm, the fabrication of the polysilicon transistor is difficult and takes a long time.

Following is a description of a method for fabricating a semiconductor device of a micronite pattern by using the KrF light source in accordance with the related art. The related art method for fabricating a semiconductor device will be described with reference to the attached drawings.

FIGS. 1A-1G illustrate sectional views of a semiconductor device as it is fabricated according to a method of the related art.

Referring to FIG. 1A, a gate insulating film 11, a polysilicon layer 12, a first insulating film 13, and a Bottom Anti-Reflection Coating (BARC) 14 are deposited on an entire surface of a substrate 10. The BARC serves for preventing a standing wave from occurring, in which a light passed through a photoresist film and interfers with a light reflected by the wafer during an exposure step thereby impairing the formation of a pattern profile after exposure and development of the photoresist film.

A photoresist film is coated on an entire surface of the substrate 10 including the BARC 14, and subjected to selective exposure and development, to form a photoresist film pattern 15.

Referring to FIG. 1B, the photoresist film pattern 15 is used as a mask for the selective removal of the BARC 14, to form a BARC pattern 14a.

Referring to FIG. 1C, the photoresist film pattern 15 is also used as a mask for etching the underlying first insulating film 13, to form a first insulating film pattern 13a.

Referring to FIG. 1D, a second insulating film 16 is formed on an entire surface of the polysilicon layer 12 including the insulating film pattern 13a.

Referring to FIG. 1E, an etch-back of the second insulating film 16 is performed to form sidewall spacers 16a at sidewalls of the first insulating film pattern 13a. The etch-back is an anisotropic etching of flat surfaces so that, in FIG. 1E, the second insulating film 16 is removed completely from an upper side of the polysilicon layer 12 and an upper side of the first insulating film pattern 13a, both of which are the flat surfaces, while only slightly removed from an upper side of sidewalls of the first insulating film pattern 13a, thereby leaving a portion of the second insulating film 16 even after the etching.

Referring to FIG. 1F, the first insulating film pattern 13a and the opposite sidewall spacers 16a are used as a mask for etching the polysilicon layer 12, to form a polysilicon pattern 12a.

Referring to FIG. 1G, the first insulating film pattern 13a and the sidewall spacers 16a left on the polysilicon pattern 12a are removed.

The polysilicon pattern 12a formed in this manner is used as a gate line or a gate electrode. The related art method for fabricating a semiconductor device suffers from poor process yield caused by repetitive and complicate deposition and etching steps, and contamination with defects caused by the use of many apparatuses coming from the repetitive, and complicated deposition and etching processes.

Additionally, the related art method uses an oxide hard mask to form a gate pattern with a line to line space critical dimension of below 100 nm.

Repetitive etching and film deposition as done in the related art complicate the fabrication process, require many apparatuses, and have a poor process yield caused by the contamination defects.

SUMMARY OF THE INVENTION

Accordingly, the present invention is directed to a method for fabricating a semiconductor device that substantially obviates one or more problems due to limitations and disadvantages of the related art.

An advantage of the present invention is that it provides a method for fabricating a semiconductor device, in which a by-product of etching is deposited on a photoresist film used as a mask.

Additional advantages, and features of the invention will be set forth in part in the description which follows, and will become apparent from the description, or may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a method for fabricating a semiconductor device includes the steps of depositing a polysilicon, and a bottom anti-refection coating on an entire surface of a substrate in succession, forming a photoresist film pattern on a predetermined portion of the bottom anti-refection coating, etching the bottom anti-refection coating by using the photoresist film pattern, to deposit by-product of the etching on sidewalls of the photoresist pattern to form spacers, and etching the polysilicon using the photoresist film pattern and the spacers as a mask to form a line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or like parts.

A method for fabricating a semiconductor device in accordance with an exemplary embodiment of the present invention will be described in detail with reference to the attached drawings.

Figure 1A:
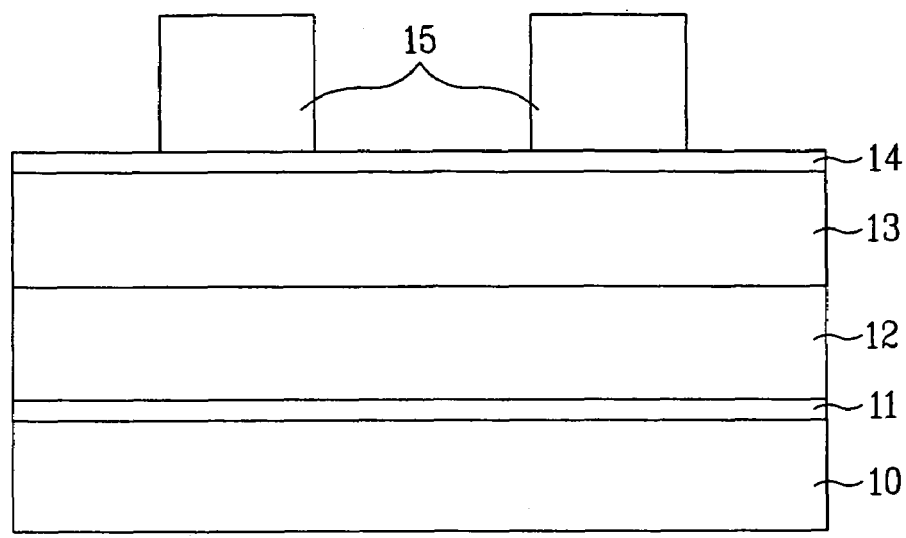
FIGS. 1A-1G illustrate sectional views of a semiconductor device being manufactured in accordance with a related art method.
Figure 1B:
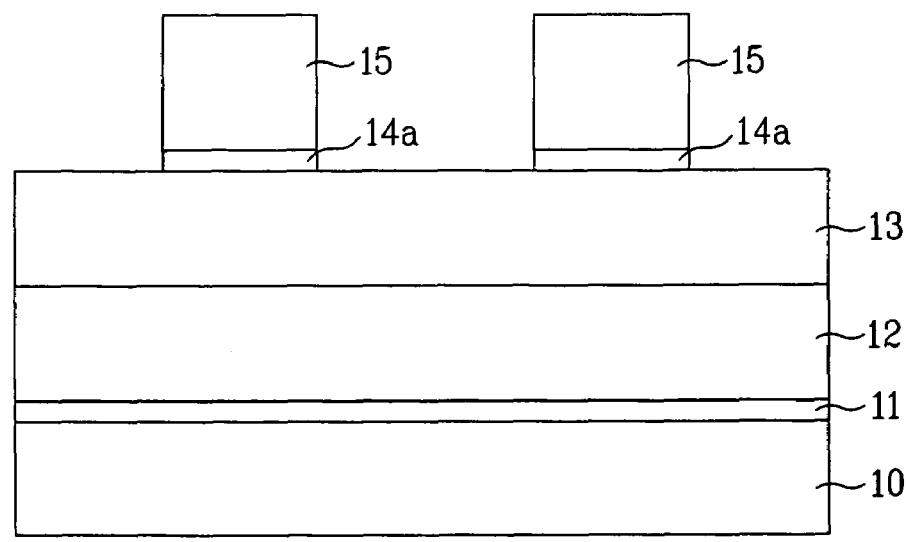
Figure 1C:
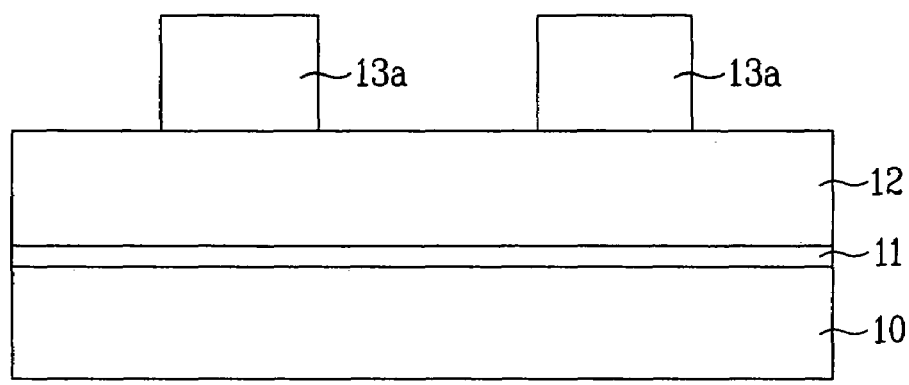
Figure 1D:
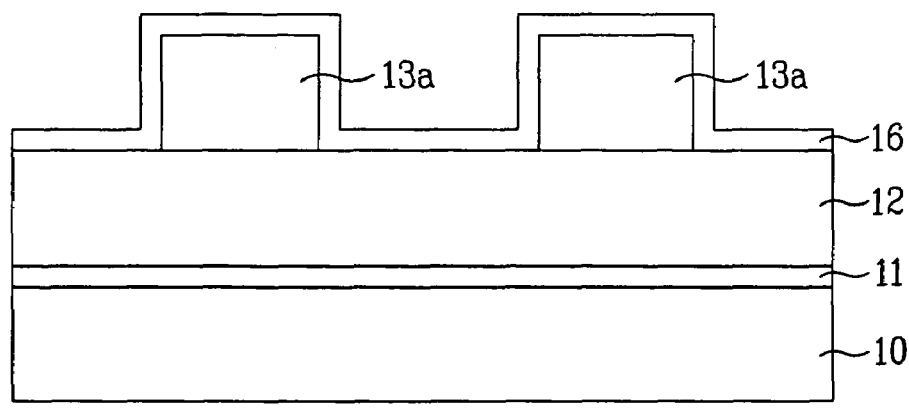
Figure 1E:
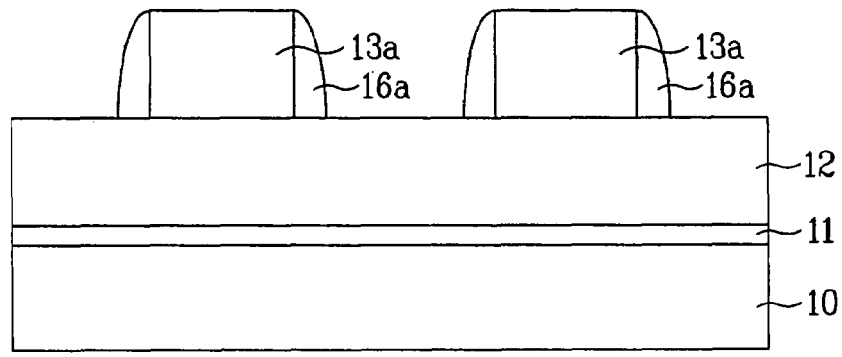
Figure 1F:
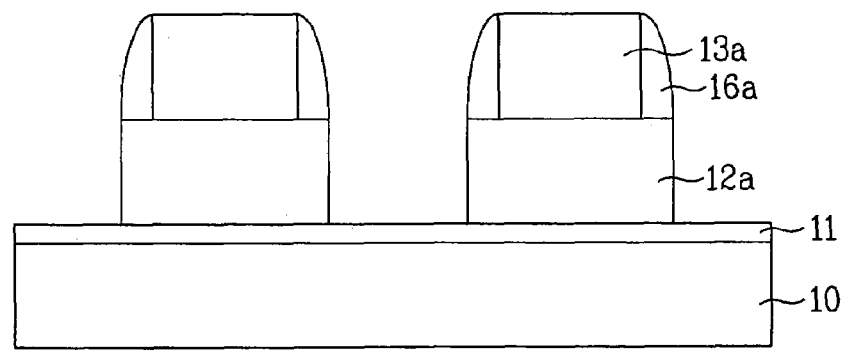
Figure 1G:
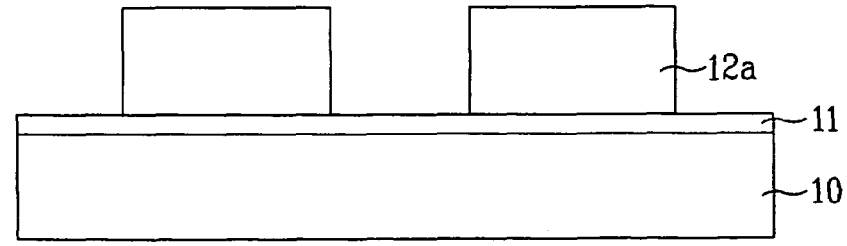
Figure 2A:
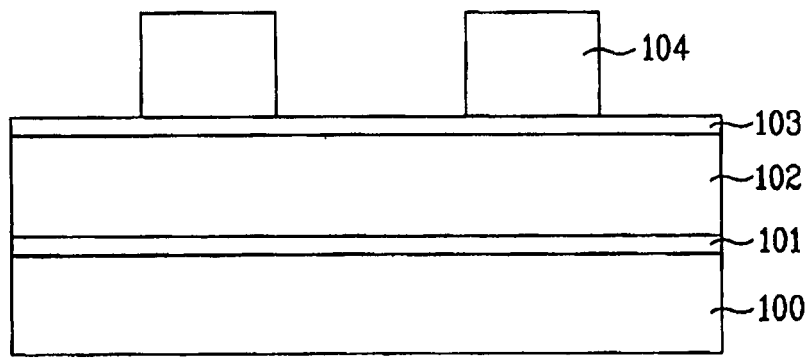
FIGS. 2A-2C illustrate sectional views of a semiconductor device being manufactured in accordance with an exemplary embodiment of the present invention.
Figure 2B:
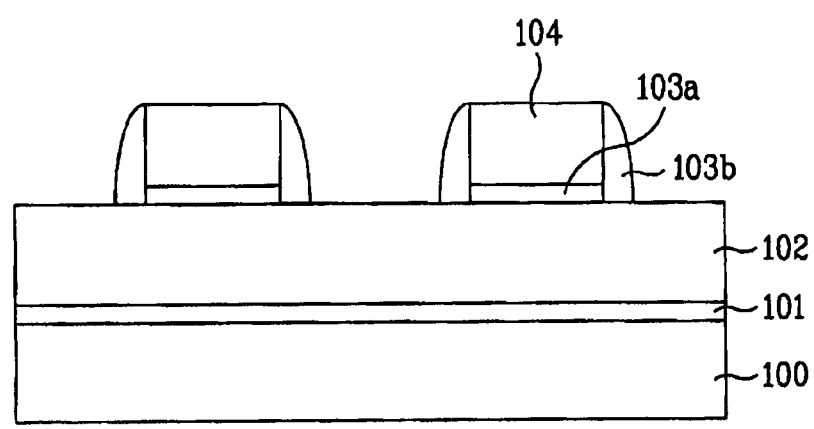
Figure 2C:
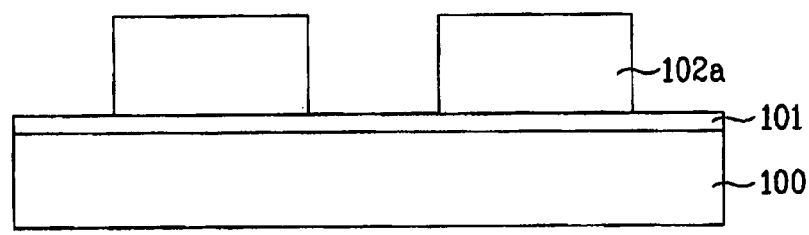

FIGS. 2A-2C illustrate sectional views of a semiconductor device being fabricated by a method in accordance with an exemplary embodiment of the present invention.

Referring to FIG. 2A, a gate insulating film 101, a polysilicon layer 102, and a Bottom Anti-Reflection Coating (BARC) 103 are sequentially deposited on a substrate 100. The BARC serves to prevent a standing wave from occurring in which a light passed through a photoresist film causes interference with light reflected by the wafer during exposure thereby preventing a pattern profile after exposure and development of the photoresist film.

A photoresist film is coated on an entire surface of the substrate 100 including the BARC 103, and subjected to selective exposure and development, to form a photoresist film pattern 104.

Referring to FIG. 2B, the photoresist film pattern 104 is used as a mask for etching the BARC 103, to cause a by-product of a CxFy group formed in the etching to deposit on a surface of the photoresist film pattern 104, and to make a Critical Dimension (CD) of the photoresist pattern 104 greater. The process results in the etch by-product to be deposited not on a surface of the polysilicon layer 102, and instead only on an upper side surface and a side surface of the photoresist film pattern. The by-product deposited on the surface of the polysilicon layer 102 impedes etching of the polysilicon.

FIG. 2B illustrates a sectional view of the semiconductor device showing sidewall spacers 103b formed of the by-product deposited on sidewalls of the photoresist film pattern 104 and the BARC pattern 103a stacked in succession. Though not shown, there may also be by-product left on the photoresist film pattern 104.

Conditions for etching the BARC 103, and forming the sidewall spacers 103b will be reviewed. The etching of the BARC 103, and the formation of the sidewall spacers 103b are done using a Capacitive Coupled Plasma (CCP) apparatus, with the following conditions.

In the etching the BARC 103 to form the BARC pattern 103a, about 60-100 sccm of $CF_4$, about 100-150 sccm of Ar, and about 5-15 sccm of $O_2$ are supplied for about 10-20 seconds at about 40-70 mT of pressure, and about 500-1000 W of power. Also, the gap between a plasma source (not shown) and the substrate 100 is about 25-30 mm in the CCP apparatus.

The by-product is deposited on the photoresist film pattern 104 using, $O_2$ for about 15-30 seconds at about 20-50 mT of pressure and about 500-1000 W of power, with a gap of 25-30 mm between the plasma source (not shown) and the substrate 100.

The etching of the BARC 103, and the deposition of the by-product on a surface of the photoresist film pattern 104 are made in the CCP apparatus by applying RF power after injection of a reactive gas with the photoresist film pattern 104 into a chamber to form plasma to perform etching using radicals. The residence time period of the by-product of etching may be elongated to increase the probability that the by-product will deposit on the photoresist pattern 104, so that the critical dimension of the photoresist film pattern having the by-product deposited thereon is increased so that it is larger than the critical dimension of the photoresist film pattern measured after an original exposure. After increasing the critical dimension so that it is larger than the critical dimension measured after the original exposure by elongating the by-product residence time period, to increase the probability of deposition of the by-product on the photoresist film pattern 104, the polysilicon layer 102 of a gate is etched by using the photoresist pattern 104+103b having the by-product deposited thereon.

Referring to FIG. 2C, the sidewall spacers 103b of by-product and the photoresist film pattern 104 are used as a mask in etching the polysilicon layer 102, to form a gate line 102a or a gate electrode. If the by-product is not deposited on the photoresist film pattern 104, the etching of the polysilicon layer 102 by using the by-product mask is not possible.

All of the photoresist film pattern 104, the underlying BARC pattern 103a, and the sidewall spacers 103b are then removed. The polysilicon layer pattern left in this manner is the line 102a. The line may be a gate line or a gate electrode.

The method for fabricating a semiconductor device according to an exemplary embodiment of the present invention permits to obtain a result in which a critical dimension of an actual width of the line is increased in a range of about 100-200 nm compared to a critical dimension (a width of the photoresist film pattern: CD) of each of pattern lines of the photoresist film pattern 104 after exposure. Accordingly, the line to line space critical dimension can be formed to be blow 100 nm. In the method for fabricating a semiconductor device in accordance with an exemplary embodiment of the present invention, the line is constructed of a polysilicon layer.

The plasma etching is performed using plasma in a dry anisotropic etching process, during which an etch gas is supplied to a particular layer to be etched in a plasma etch chamber, and a RF field having a high energy is applied thereto to excite gas molecules to high energy levels so that the gas molecules can react with the layer to etch the layer.

In the anisotropic etching, a plasma source is one of the most important factors. Moreover, the anisotropic etching requires conditions which conflict with one another, such as a high etch rate, a high selectivity, less damage, and so on. To meet the above conditions a scheme for using capacitive coupling plasma (CCP), and a scheme for using inductive coupled plasma (ICP) have been developed.

In the method for fabricating a semiconductor device according to an exemplary embodiment of the present invention, the capacitive coupled plasma (CCP) apparatus may be used in the process of etching the BARC and of the forming sidewall spacers of the by-product. The CCP apparatus uses Dipole Ring Magnetron (DRM).

SEM photographs of a top view image of the polysilicon gate, and a section after the etching to form the polysilicon gate indicate that the method for fabricating a semiconductor device according to an exemplary embodiment of the present invention permits to obtain the same result of the related art but with fewer steps.

Figure 3A:
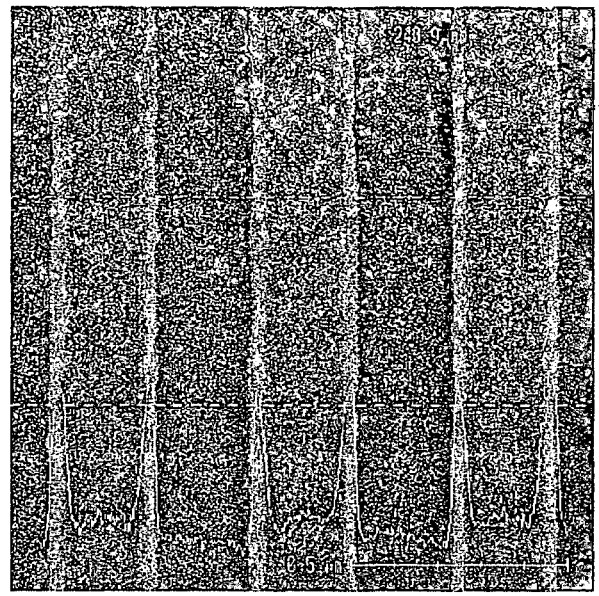
FIGS. 3A-3C illustrate SEM (Scanning Electron Microscope) images of plan views of the semiconductor device in the steps of FIGS. 2A-2C respectively.
Figure 3B:
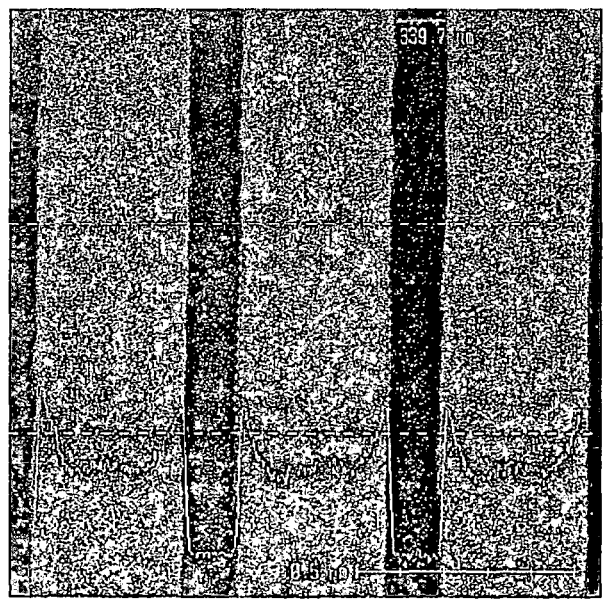
Figure 3C:
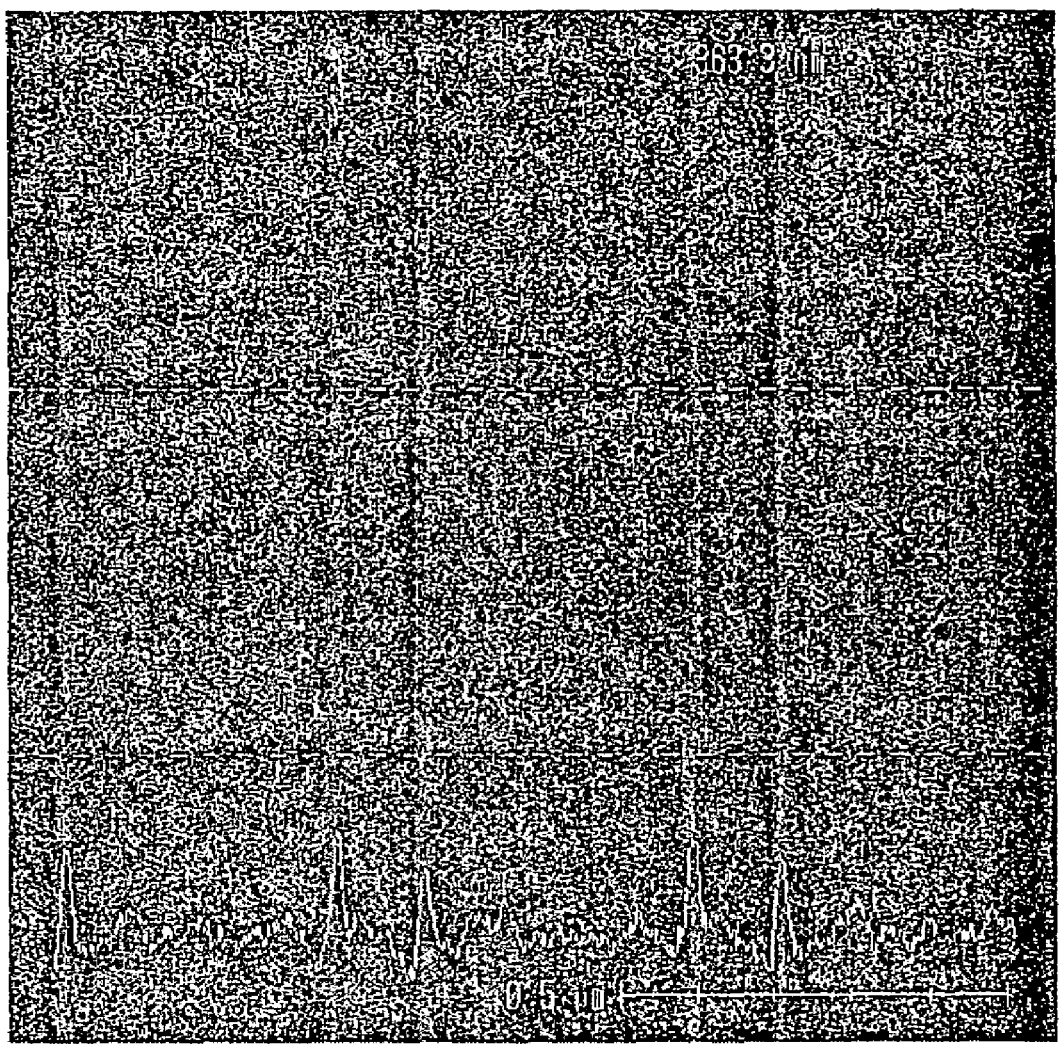
Figure 4A:
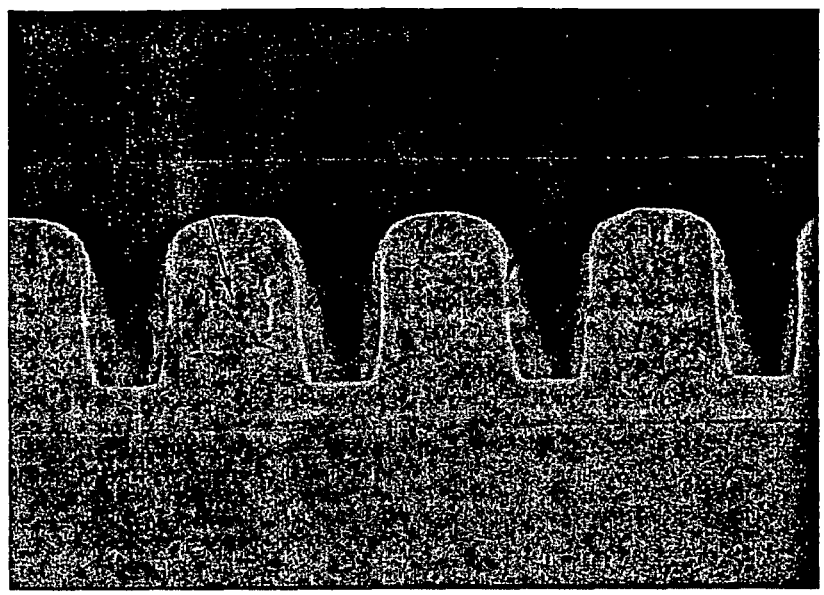
FIGS. 4A and 4B illustrate SEM images of sectional views of the semiconductor device in the steps of FIGS. 2B and 2C, respectively.
Figure 4B:
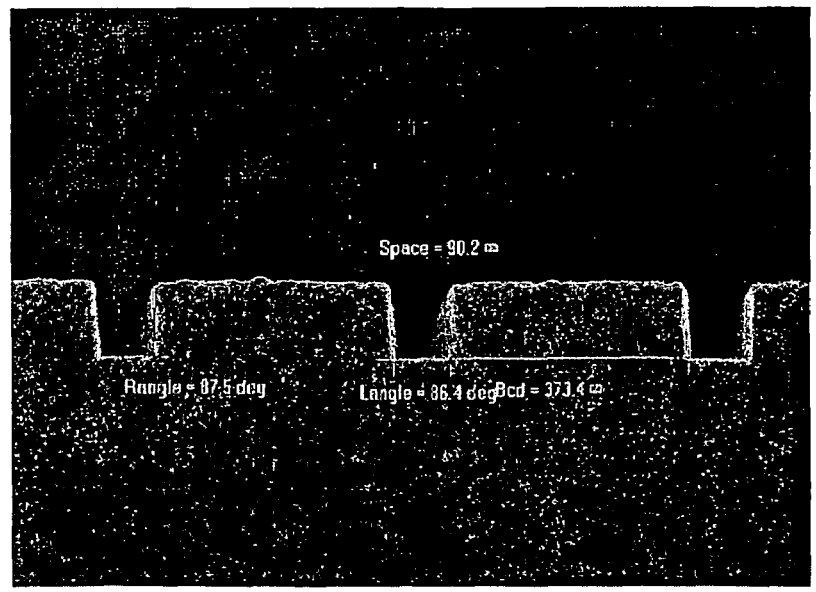

FIGS. 3A-3C illustrate plan views of the semiconductor substrate taken by SEM (Scanning Electron Microscope) during the steps of FIGS. 2A-2C respectively, and FIGS. 4A and 4B illustrate sectional views taken by SEM in the steps of FIGS. 2B and 2C, respectively.

Referring to FIG. 3A, a plan view of the photoresist film pattern 104 formed in this manner shows photoresist patterns arranged in one direction at regular intervals, with spaces defined at similar intervals between the photoresist patterns 104.

Referring to FIGS. 3B and 4A, the BARC 103 under the photoresist film pattern 104 is etched to form the spacers 103b of by-product from the etching at sidewalls of the photoresist film pattern 104 resulting in increasing a width of a hard mask as much as widths of the spacers 103b at the sidewalls of the photoresist film pattern 104, thereby reducing a width of the space between hard mask patterns (104+103b), relatively.

FIGS. 3C and 4B each illustrates a line formed by etching the polysilicon layer 102 with the hard mask, wherefrom it can be shown that only lower sides of portions between adjacent hard mask patterns are exposed, and consequently removed by etching solution.

In the method for fabricating a semiconductor device according to an exemplary embodiment of the present invention, an exposure is made with a 248 nm light source and a KrF photoresist film, wherein by-product of etching of a BARC under the photoresist film is used as a hard mask, by means of which etching can be performed enabling formation of a gate pattern with a line to line space critical dimension below 10 nm, even if no micronite light source is used.

The above fabrication process permits reduction in steps in the fabrication process compared to the related art, and avoids expensive photoresist film for ArF and apparatus thereof to carry out a process for fabricating a semiconductor device having a micronite line to line space critical dimension.

As has been described, the method for fabricating a semiconductor device of the present invention has the following advantages.

By not removing the by-product of etching of a BARC under a photoresist pattern right away, but by depositing the by-product on a surface of the photoresist pattern, a hard mask with a greater width is formed with which an underlying polysilicon layer may be etched to form a polysilicon gate.

Accordingly, there is no need for a high definition photoresist film and apparatus for forming a gate polysilicon space with a line to line space below 100 nm. However, even if a 248 nm KrF photoresist film and apparatus thereof are used, formation of a micronite space is possible in correspondence to a space between adjacent hard mask patterns by forming the hard mask by growing widths of the photoresist film pattern by using the by-product. Thus, even if a design rule is small, the same effect is obtainable by using the KrF photoresist film and apparatus thereof without using the expensive apparatus (the ArF apparatus and the photoresist film thereof).

The method for fabricating a semiconductor device of the present invention allows to reduce the fabrication process from 7 or more steps down to 3 steps, thereby enhancing effectiveness of apparatus in etching, and reducing defective factors that are likely to occur during the steps coming from many steps. According to this, the yield can be increased.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device comprising:
   sequentially depositing a polysilicon and a bottom anti-refection coating on an entire surface of a substrate;
   forming a photoresist film pattern on a predetermined portion of the bottom anti-refection coating;
   etching the bottom anti-refection coating by using the photoresist film pattern, to deposit by-product of the etching on sidewalls of the photoresist pattern, but not on a surface of the polysilicon, to form spacers; and
   etching the polysilicon using the photoresist film pattern and the spacers as a mask to form a line.

2. The method as claimed in claim 1, wherein the step of etching the bottom anti-refection coating is performed by a capacitive coupled plasma apparatus.

3. The method as claimed in claim 2, wherein the etching of the bottom anti-refection coating in the capacitive coupled plasma apparatus is performed by supplying 60-100 sccm of $CF_4$, 100-150 sccm of Ar, and 5-15 sccm of $O_2$ at 40-70 mT of pressure, and 500-1000 W of power.

4. The method as claimed in claim 3, wherein the etching of the bottom anti-refection coating is performed for 10-20 seconds.

5. The method as claimed in claim 3, wherein the etching of the bottom anti-refection coating is performed with a gap of 25-30 mm between a plasma source and the substrate in the capacitive coupled plasma apparatus.

6. The method as claimed in claim 2, wherein the spacers are formed in the capacitive coupled plasma apparatus by supplying 10-30 sccm of $C_5F_8$, 2-10 sccm of $CH_2F_2$, 50-100 sccm of Ar, and 0-5 sccm of $O_2$ at 20-50 mT of pressure and 500-1000 W of power, with a gap of 25-30 mm between the plasma source (not shown) and the substrate 100.

7. The method as claimed in claim 6, wherein the formation of the spacers is performed with a gap of 25-30 mm between a plasma source and the substrate in the capacitive coupled plasma apparatus.

8. The method as claimed in claim 6, wherein the formation of the spacers is performed for 15-30 seconds.

\* \* \* \* \*